United States Patent
Tang et al.

(10) Patent No.: US 11,621,148 B2
(45) Date of Patent: Apr. 4, 2023

(54) PLASMA IMMERSION METHODS FOR ION IMPLANTATION

(71) Applicant: ENTEGRIS, INC., Billerica, MA (US)

(72) Inventors: Ying Tang, Brookfield, CT (US);
Bryan C. Hendrix, Danbury, CT (US);
Oleg Byl, Southbury, CT (US); Sharad N. Yedave, Danbury, CT (US)

(73) Assignee: ENTEGRIS, INC., Billerica, MA (US)

( * ) Notice: Subject to any disclaimer, the term of this patent is extended or adjusted under 35 U.S.C. 154(b) by 392 days.

(21) Appl. No.: 17/024,261

(22) Filed: Sep. 17, 2020

(65) Prior Publication Data
US 2021/0090860 A1 Mar. 25, 2021

Related U.S. Application Data

(60) Provisional application No. 62/903,236, filed on Sep. 20, 2019.

(51) Int. Cl.
*H01J 37/32* (2006.01)
*C23C 14/48* (2006.01)
*C23C 14/06* (2006.01)

(52) U.S. Cl.
CPC ...... *H01J 37/32412* (2013.01); *C23C 14/067* (2013.01); *C23C 14/48* (2013.01); *H01J 37/32082* (2013.01); *H01J 37/32357* (2013.01); *H01J 37/32422* (2013.01); *H01J 37/32449* (2013.01)

(58) Field of Classification Search
CPC ............... C23C 14/48; H01J 37/32082; H01J 37/32357; H01J 37/32412; H01J 37/32422
See application file for complete search history.

(56) References Cited

U.S. PATENT DOCUMENTS

| | | | | |
|---|---|---|---|---|
| 5,793,090 | A * | 8/1998 | Gardner | H01L 29/7833 257/E29.268 |
| 7,183,177 | B2 * | 2/2007 | Al-Bayati | H01L 21/2236 257/E21.32 |
| 9,111,860 | B2 | 8/2015 | Jones | |
| 9,548,181 | B2 | 1/2017 | Sinha | |
| 2005/0070073 | A1 * | 3/2005 | Al-Bayati | H01J 37/321 438/460 |
| 2013/0095643 | A1 * | 4/2013 | Santhanam | H01J 37/32412 257/E21.334 |
| 2014/0080276 | A1 * | 3/2014 | Brand | H01L 29/66803 438/283 |

(Continued)

FOREIGN PATENT DOCUMENTS

TW 607492 B 12/2017

OTHER PUBLICATIONS

Burenkov, A., et al., "Simulation of BF3 Plasma Immersion Ion Implantation into Silicon", Ion Implantation Technology 2012, pp. 233-236.

(Continued)

*Primary Examiner* — Jaehwan Oh

(57) ABSTRACT

Described are plasma immersion ion implantation methods that use multiple precursor gases, particularly for the purpose of controlling an amount of a specific atomic dopant species that becomes implanted into a workpiece relative to other atomic species that also become implanted into the workpiece during the implantation process.

19 Claims, 1 Drawing Sheet

(56) References Cited

U.S. PATENT DOCUMENTS

| | | | | |
|---|---|---|---|---|
| 2015/0325412 A1* | 11/2015 | Torregrosa | ........ | H01J 37/32357 |
| | | | | 250/492.3 |
| 2015/0357167 A1* | 12/2015 | Lee | .................. | H01J 37/32678 |
| | | | | 118/723 MP |
| 2015/0380212 A1 | 12/2015 | Byl | | |

OTHER PUBLICATIONS

Kaeppelin, V. et al., "Characterisation of an industrial plasma immersion ion implantation reactor with a Langmuir probe and an energy-selective mass spectrometer"; Surface and Coatings Technology 156 (2002), pp. 119-124.

Koo, B-W et al, "Plasma Diagnostics in Pulsed Plasma Doping (P2LAD) System", IEEE Transactions on Plasma Science, vol. 32, No. 2, Apr. 2004, pp. 456-463.

* cited by examiner

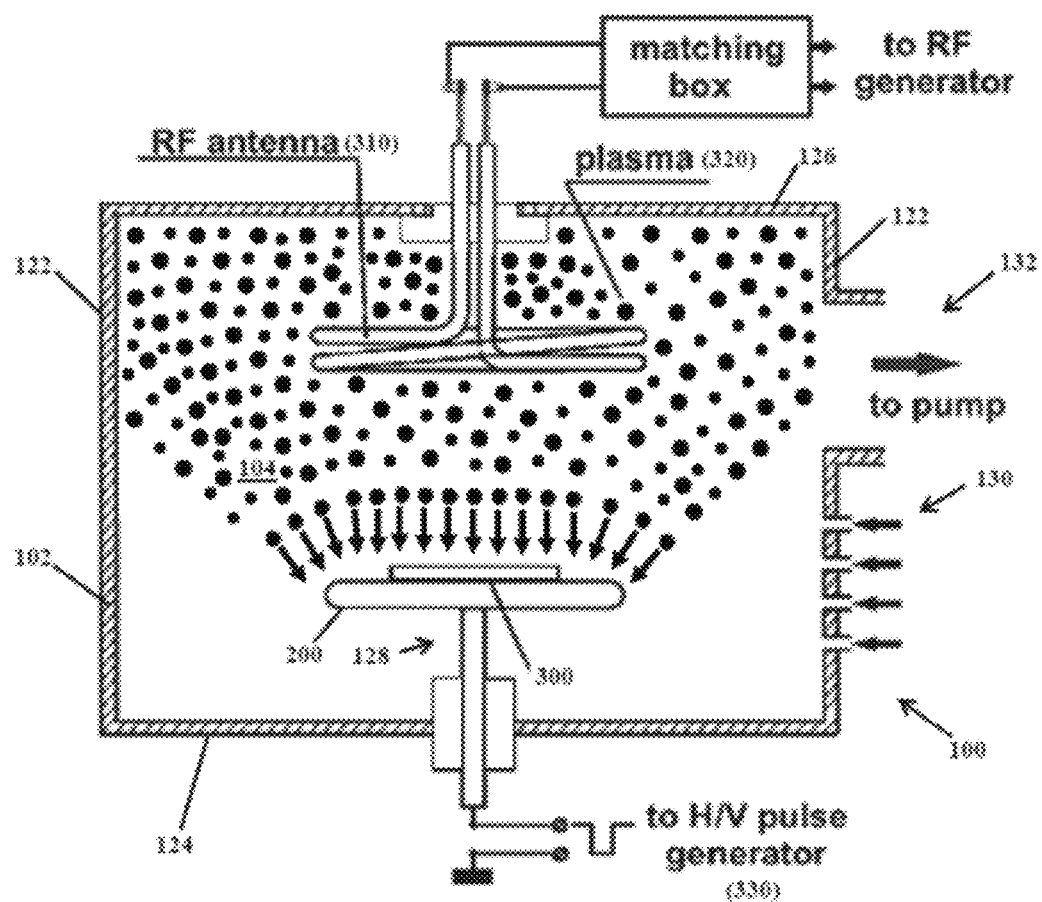

PLASMA IMMERSION METHODS FOR ION IMPLANTATION

FIELD

The following description relates to plasma immersion ion implantation methods that use multiple precursor gases, particularly for the purpose of controlling an amount of a specific atomic dopant species that becomes implanted into a workpiece relative to other atomic species that also become implanted into the workpiece during the implantation process.

BACKGROUND

In the materials and semiconductor processing industries there are various reasons for modifying the chemical makeup of a solid material by introducing one or more additional chemical species to the chemical makeup of the solid material. Adding a small amount of a different atom or ion to the ordered structure of the solid material can have a useful and significant effect on a material property of the solid material. For example, small amounts of dopant atoms are conventionally added to semiconductor materials to affect the conductivity properties of the semiconductor material. Nitrogen or carbon atoms may be added to a solid material to improve a mechanical property such as strength or wear resistance. In other examples, a small amount of impurity can be added to a solid material to affect an optical property of the solid material.

One common technique for implanting a dopant or impurity into a solid material is ion beam implantation. Ion beam implantation techniques inject a relatively pure single ionic species into a solid material, to cause a desired modification of a chemical, optical, or mechanical property of the implanted material. A typical ion beam implantation system includes an ionization chamber that functions to form plasma of ions that contains a mixture of many ionic species. The mixture of ions is passed through an orifice in the ionization chamber and into a high vacuum region where the ions are accelerated by an electric field to form an ion beam. The ion beam then passes through a mass analyzer to select and isolate a single ion species for implantation. By this method, an ion beam can be formed to include a high concentration of a selected ionic species from a mixture of ionic species in a plasma, for implantation of the single ionic species into a workpiece.

Another technique for ion implantation is plasma immersion ion implantation. Plasma immersion ion implantation techniques produce a plasma in a chamber, and the plasma contains a mixture of different chemical ionic species. A workpiece is placed in the chamber and is surrounded by the plasma that contains the mixture of ionic species. An electric potential is placed at a vicinity of the workpiece, such as below the workpiece, to cause ions in the plasma that have an opposite charge (relative to the potential) to be accelerated toward the workpiece and become implanted in the workpiece.

Comparing plasma immersion techniques with beamline techniques shows that a balance of cost, complexity, and performance features exists between the two. A conventional (beamline) ion implantation processing chamber generates an ion beam of high energy ions that penetrate relatively deeply into the workpiece, as compared to the lower-energy ions implanted by the plasma immersion ion implantation process. The ions provided in the plasma immersion ion implantation process do not generally have the same high energy, and are typically implanted to a reduced depth compared to that of beamline implantation methods. The amount of energy required to perform a plasma immersion ion implantation process is, accordingly, less than the amount of energy needed to perform a beamline ion implantation process. The higher energy required from the beamline ion implantation process can provide ions with higher implantation energy to penetrate into a deeper region from the substrate surface, but adds cost and operating complexity. In contrast, the plasma immersion ion implantation process uses RF power (a radio frequency power generator) to dissociate ions into plasma, which requires less energy and equipment of reduced complexity. Also, plasma immersion ion implant can perform high dose implantation in a relatively short period of time, thus improving throughput. Accordingly, plasma immersion ion implantation processes may be considered an economically-efficient ion implantation technique for certain low energy and high dose processes as compared to beamline implantation techniques.

A performance difference that results from eliminating an ion beam is reduced selectivity of the ionic species and atomic species that become implanted by a plasma immersion process. Plasma immersion techniques do not involve an ion beam that may be filtered to isolate (select) a desired ionic species of a plasma for implantation. Plasma ion implantation techniques are not effective to select a particular species of ions from a plasma, for implantation. All ions in a plasma having a common charge are accelerated toward the workpiece and will become implanted into the workpiece, meaning that multiple different types of ionic species and atomic species will become implanted in the wafer. If a plasma includes a mixture of ionic species that includes boron, fluorine, and hydrogen atoms as atomic species, some amounts of boron, fluorine, and hydrogen will become implanted into the workpiece.

Based on the non-selective nature of this implantation technique, a significant technical challenge that is present with plasma immersion techniques is an inadequate level of control of the relative amounts of different atomic species that become implanted in a workpiece. To a limited degree, a ratio of implanted atomic species may be affected by plasma tool parameter tuning. But because the level of control that may be provided in this manner is limited, a need exists for techniques that provide better control over a ratio of the amounts of atomic species implanted when using a plasma immersion technique.

SUMMARY

The invention describes techniques that allow for improved control of relative amounts of atomic species that become implanted in a workpiece ("implanted atomic species") using plasma immersion ion implantation techniques. The method includes selecting and using a combination of two or more different gaseous precursors to generate a plasma used in a plasma immersion ion implantation process. The chemical compositions of the gaseous precursors and their relative amounts are selected to cause an increased amount of a selected atomic species (e.g., a "dopant") being implanted in the workpiece relative to other less desired or undesired atomic species that also become implanted in the workpiece during the implantation process.

In one aspect, the invention relates to an ion implantation method. The method includes: supporting a workpiece in a chamber; generating plasma from a precursor mixture that includes a first precursor and at least one additional precursor different from the first precursor, wherein the plasma includes at least two different plasma ion species, and the at least two different plasma ion species include a selected atomic species and one or more additional atomic species. The method also includes applying electrical potential to the workpiece so that the at least two different plasma ion species accelerate toward the workpiece to cause the selected atomic species and the one or more additional atomic species to become implanted on the workpiece surface. The at least one additional precursor causes an increased amount of the selected atomic species to become implanted in the workpiece.

In another aspect the invention relates to a plasma immersion ion implantation system that includes a chamber comprising: a plasma generator comprising an RF antenna, a workpiece support, and an electrode. The system also includes a source of a first precursor and a source of at least one additional precursor different from the first precursor. The system is adapted to: support a workpiece on the workpiece support and generate plasma from the precursors. The plasma includes at least two different plasma ion species, and the two plasma ion species include a selected atomic species and one or more additional atomic species. The system is also adapted to cause the at least two different plasma ion species to accelerate toward the workpiece to cause the selected atomic species and the one or more additional atomic species to become implanted on the workpiece surface. The at least one additional precursor causes an increased amount of the selected atomic species to become implanted in the workpiece.

BRIEF DESCRIPTION OF THE FIGURE

FIG. 1 illustrates an example plasma immersion ion implantation tool and system useful for a method of the description.

DETAILED DESCRIPTION

The following describes plasma immersion ion implantation techniques that use two or more chemically different gaseous precursors to form a plasma.

Plasma immersion techniques are non-selective with respect to ionic species of a plasma mixture that become implanted in a workpiece. The techniques generally involve non-selective implantation of ionic species from a plasma that contains a mixture of multiple chemically different ionic species. The number and types of ionic species generated will depend on the chemical makeup of a gaseous precursor used to generate the plasma. Each ionic species may contain one or multiple atomic species, and may exhibit a positive or a negative charge. A workpiece is placed in the chamber and is surrounded by the mixture of ionic species of the plasma. An electric potential causes ions that have an opposite charge relative to the potential to be accelerated toward the workpiece and to become implanted in the workpiece. The implantation is non-selective, i.e., uncontrolled, with respect to the different types of ions (having a common charge) and amounts of different atomic species present in the plasma that become implanted. All ionic species in the plasma that have a charge that is opposite of the potential are accelerated to the workpiece, regardless of chemical composition.

According to the invention, the Applicant has identified techniques that allow for improved control of relative amounts of atomic species that become implanted in a workpiece using plasma immersion ion implantation techniques. The method includes selecting and using a combination of two or more chemically different gaseous precursors to generate a plasma used with the plasma immersion ion implantation technique. The chemical compositions of the two or more different gaseous precursors, and the relative amounts of each that are selected and used to produce the plasma, can be selected and controlled to cause an increased amount of a particularly desired atomic species (e.g., a "dopant"), referred to herein as a "selected atomic species," being implanted in a workpiece relative to other less desired or undesired atomic species ("additional atomic species") that also become implanted in the workpiece during the implantation process.

Plasma immersion ion implantation methods of the present description involve generating plasma from two or more chemically different gaseous precursors for implantation by a plasma immersion implantation technique. At least one of the gaseous precursors includes an atomic species that is desired for implantation into a workpiece (a "selected" atomic species), e.g., to function as a dopant species when present in the composition of the workpiece. Methods as described allow for improved control of the relative amount of the selected atomic species that becomes implanted into the workpiece compared to other implanted atomic species, especially to cause a high amount (percentage) of the selected atomic species being implanted compared to the amount of other (additional) atomic species that become implanted in the workpiece.

Based on two particular (non-limiting) examples of methods as described, an atomic species implanted into a workpiece may be boron, fluorine, or a combination of boron and fluorine. Boron and fluorine are commonly used in semiconductor materials as dopants species.

While the present description uses boron and fluorine as two specific examples of implanted (e.g., "dopant") species, either of which may be a "selected" atomic species, the methods of the present description may be effective for use with other atomic species as implanted species; e.g., a described method may be useful to control or increase an amount (percentage) of a particular selected atomic species (different from fluorine or boron) that becomes implanted in a workpiece relative to a total amount of implanted atomic species.

The amount of an increase in an amount of selected atomic species that becomes implanted in the workpiece can be at least 5 percent, 10 percent, 20, 30, 50, or in some example methods up to a 100 percent increase compared to a control amount (percentage) achieved in a process that uses only one gaseous precursor (i.e., a single gaseous precursor) to prepare the plasma, i.e., in the absence of one or more additional precursor. For example, if an amount of a selected implanted atomic species implanted by a process that uses one gaseous precursor (in the absence of one or more additional precursors) to generate plasma is 35 percent of total atomic species implanted in a workpiece by the process, an increased amount of the selected implanted atomic species may be at least 5, 10, 20, 30, 50, or 100 percent greater than the 35 percent base, i.e., at least 36.75, 38.5, 42, 45.5, 52.5 or 70 percent of a total amount of implanted atomic species is the selected species (and the remaining 63.25, 61.5, 58, 54.5, 47.5 and 30 percent of the total implanted atomic species is one or more additional implanted atomic species).

In this example, the 35 percent value of the selected atomic species is a baseline ("base") value of an amount of the selected species that becomes implanted by a plasma ion immersion implantation technique using a single gaseous precursor to prepare the plasma. As an example, when $BF_3$ is used alone as a single gaseous plasma precursor to prepare a plasma by a plasma ion immersion implantation technique, a baseline percent of boron that becomes implanted as an implanted atomic species may be in a range of about 34 to about 35 percent (atomic), with the balance of implanted atomic species, i.e., from about 65 to about 66 percent (atomic), being fluorine. An increased relative amount of boron as a selected implanted atomic species may be an amount that is at least 5, 10, 20, 30, 50, or 100 percent (atomic) greater than the 35 percent base, as a percentage of total implanted atomic species, e.g., an amount of implanted boron of at least 36.75, 38.5, 42, 45.5, 52.5, or 70 percent (atomic), based on a total amount of all implanted atomic species.

According to typical (previous and current) commercial processes for implanting boron or fluorine as a selected atomic species, either $BF_3$ or $B_2H_6$ is used as the gaseous precursor. When $BF_3$ is the precursor, the plasma will contain $B^+$, $F^+$, $BF^+$, $BF_2^+$ and $BF_3^+$ ions. These various ionic species, and the atomic species of boron and fluorine from these ions, will become implanted into a workpiece with no selectivity of either the ionic species or either atomic species to control relative amounts of boron and fluorine that become implanted.

According to methods of this description, a plasma can be generated from two or more chemically different gaseous precursors, and the gaseous precursors can be selected specifically to cause a relatively high or increased amount of a particularly desired (i.e., "selected") atomic species to be implanted in a workpiece relative to all (selected and non-selected) atomic species that become implanted. The amount of the selected implanted atomic species that is implanted in the workpiece as a percentage of total implanted atomic species (total selected implanted species and implanted non-selected species) can be at least 20, e.g., 25, 35, 45, 55, 65 percent; i.e., the amount of selected implanted atomic species can be at least 20, e.g., 25, 35, 45, 55, 65 percent or higher of a total amount of implanted selected atomic species and implanted non-selected atomic species. As described, the use of two or more chemically different gaseous precursors to generate the plasma is a technique that can be useful to increase an amount of a selected atomic species that is implanted into a workpiece relative to a total amount of all atomic species implanted, when compared to a comparable plasma immersion ion implantation process that generates the plasma from only a single gaseous precursor. According to described methods, plasma is generated from a precursor mixture that includes a first precursor and at least one additional precursor different from the first precursor. The plasma includes at least two different plasma ion species, and the at least two different plasma ion species include a selected atomic species and one or more additional atomic species. The at least one additional precursor used to form the plasma causes an increased amount (percentage) of the selected atomic species to become implanted in the workpiece relative to all implanted atomic species, compared to the amount of the selected atomic species that becomes implanted by performing the method without using the at least one additional precursor to form the plasma, i.e., by forming the plasma with only the first precursor.

According to useful and preferred examples of the described methods, a selected atomic species can be boron or fluorine, and gaseous precursors that can be used to produce the plasma can include a combination of two or more chemically different gaseous precursors selected from one of the following groups (e.g., both precursors may be selected from a single group), or selected from two or more of the following groups.

Group A—Boron fluoride gases: $BF_3$, $B_2F_4$, $B_xF_y$.
Group B—Boron hydride gases: $B_2H_6$, $B_xH_y$.
Group C—Mixed boron fluorohydrides: $BHF_2$, $BH_2F$, $B_xH_yF_z$.
Group D—Other boron gases: $BCl_3$, $B_xA_y$ (A can be an element other than fluorine).
Group E—Fluorine or fluoride gases (non-boron): $F_2$, $SiF_4$, $Si_2F_6$, $GeF_4$, $Ge_2F_6$, $CF_4$, $C_2F_6$, $XeF_2$, $PF_3$, $PF_5$, $AsF_3$, $AsF_5$, $NF_3$, $SF_6$, $A_xF_y$ (A can be an element other than boron).
Group F—Inert gases: He, Ne, Ar, Kr, Xe and $N_2$.
Group G—Hydrogen and hydride gases: $H_2$, $SiH_4$, $Si_2H_6$, $GeH_4$, $Ge_2H_6$, $PH_3$, $AsH_3$, $CH_4$, $C_2H_6$, $NH_3$, $A_xH_y$.
Group H—Oxygen and oxide gases: $O_2$, $O_3$, $N_2O$, $N_4O$, $NO_2$, $N_2O_3$, $N_2O_4$, $N_2O_5$, CO, $CO_2$, $A_xO_y$.

In these and other example methods, a plasma may be generated from gaseous precursors that contain a combination of two chemically different gaseous precursors as described, selected from one or more of groups A, B, C, D, and E, and may additionally include one or more gases selected from groups F, G, and H. The relative amount of a first precursor to a second precursor may be any that is effective or preferred, for example a relative amount in a from 10:90 to 90:10 (molar), e.g., a relative amount in a range from 40:60 to 60:40.

According to other example methods, the plasma may include one or more of a third gaseous precursor, a fourth gaseous precursor, and a fifth or additional gaseous precursor, each one being selected from any of groups A, B, C, D, and E.

In certain particular example methods, the selected atomic species is boron and the two gaseous precursor can both be selected from group A. Alternately, the two gaseous precursors can be selected by using one gaseous precursor from group B and one gaseous precursor from group D. As examples: the first gaseous precursor can be $BF_3$ and the second gaseous precursor can be $B_2F_4$; or the first gaseous precursor can be $BF_3$ and the second gaseous precursor can be $B_2H_6$; or the first gaseous precursor can be $B_2F_4$ and the second gaseous precursor can be $B_2F_6$.

In these example methods, boron is the selected atomic species and fluorine and optionally hydrogen are non-selected atomic species. The amount of boron that becomes implanted in a workpiece as a selected atomic species can be at least 20, e.g., 25, 35, 45, 55, 65, 75, 85, or 95 percent (atomic) of total implanted atomic species; i.e., the amount of implanted boron is at least 20, e.g., 25, 35, 45, 55, 65, 75, 85, or 95 percent (atomic) of the total amount of implanted boron and implanted non-boron atomic species. In preferred example methods the amount (percentage, atomic) of boron that becomes implanted in a workpiece relative to a total amount of all implanted atomic species (boron plus non-boron atomic species) in the workpiece, when the plasma is derived from a combination of two or more chemically different gaseous precursors as described, can be greater than an amount (percentage, atomic) of boron that is implanted by a comparable (e.g., identical) plasma immersion ion implantation process, with an identical workpiece, that generates plasma from only one single gaseous precursor compound, e.g., $BF_3$ or $B_2F_4$, and not a mixture of two or more gaseous precursors (compounds).

As an additional potential benefit of a method as described, selecting useful or preferred types and amounts of the two or more gaseous precursors, for implanting boron as a selected atomic species, can result in a reduced level of boron particles or boron coating materials that become present or accumulated at surfaces at an interior of a chamber of a plasma immersion ion implantation tool during a plasma immersion ion implantation process. Reducing particle formation and deposition within a chamber can also increase the operating time (uptime) of a system by reducing down-time, and may also increase a useful lifetime of a plasma immersion ion implantation system.

In other example methods, the dopant atomic species is fluorine and the two gaseous precursors can both be selected from group E. As examples: the first gaseous precursor can be $F_2$ and the second gaseous precursor can be $BF_3$ or HF; or the first gaseous precursor can be $NF_3$ and the second gaseous precursor can be $CF_4$.

In these example methods, fluorine is the selected atomic species, and one or more non-fluorine atomic species of any of the two or more gaseous precursors may be a non-selected atomic species. The amount of fluorine that becomes implanted in a workpiece can be at least 40, e.g., 45, 55, 65, 75, 85, or 95 percent (atomic) of total implanted atomic species; i.e., the amount of implanted fluorine can be at least 40, e.g., at least 45, 55, 65, 75, 85, or 95 percent (atomic) of the total amount of implanted fluorine and any implanted non-fluorine atomic species. In preferred methods, the amount (percentage, atomic) of fluorine that becomes implanted in a workpiece relative to a total amount of all implanted atomic species (fluorine plus non-fluorine atomic species) in the workpiece, when the plasma is derived from a combination of two or more chemically different gaseous precursors as described, can be greater than an amount (percentage, atomic) of fluorine that is implanted by a comparable plasma immersion ion implantation process, with an identical workpiece, that generates plasma from only one gaseous precursor, e.g., $BF_3$.

A method as described, using multiple gaseous precursors to produce plasma in a plasma immersion ion implantation process, can be useful with any desired gaseous precursor, any selected atomic species, and any desired workpiece in which a selected atomic species is to be implanted. Particular methods are useful for increasing a relative amount (percentage, atomic) of selected atomic species that becomes implanted in a workpiece relative to a total amount of implanted atomic species (selected and non-selected atomic species). Such preferred methods can increase the amount (percent, atomic) of selected atomic species that is implanted in a workpiece relative to an amount of the selected atomic species that becomes implanted in a comparable (e.g., identical) workpiece prepared using a comparable implantation process that is identical to the inventive process but uses only a single gaseous precursor to generate plasma.

The plasma immersion ion implantation technique may be useful for surface doping or modification by extracting ions from plasma described herein, that contains a mixture of different types of ions, by applying a high voltage to a workpiece (held within the plasma) or an electrode that supports the workpiece to accelerate the ions toward the substrate. The accelerated ions from the plasma penetrate into the workpiece. The workpiece may be any item or device into which one or a combination of ions may be desirably introduced, e.g., a semiconductor wafer or a microelectronic device substrate. Compared to beamline implantation tools, a plasma immersion ion implantation tool can be less complicated due to the absence of a mass analyzer (required in a beamline ion implantation system) that selects desired ions for implantation from plasma that contains many different ionic species. The plasma immersion ion implantation tool does not require a device to generate, focus, and refine an ion beam. As a result, plasma immersion ion implantation techniques may produce advantages such as: a lower power requirement; a lower energy or higher dose of ions presented to a workpiece, or both; relatively better conformal doping; lower total hardware and operating costs; or two or more of these.

A method as described can be performed using a conventional plasma immersion tool that operates by known principles of plasma immersion ion implantation, and with a combination of two or more gaseous precursors as described herein. Plasma that is made of a mixture of different ionic species derived from two or more gaseous precursors can be formed by applying a high voltage RF or any other forms of EM field (microwave or DC) to a processing chamber that contains the gaseous precursors. The ions are then biased toward the workpiece surface and implanted to a desired depth from the substrate surface.

FIG. 1 shows an example plasma immersion ion implantation chamber that may be useful to perform a method as described. The chamber of FIG. 1 is useful for performing plasma immersion ion implantation processes, but may also be used to expose a substrate to energetic ions without the ions becoming implanted beneath the surface. Consequently, as used herein, the term "implanted" refers to an ion or atom that is caused to become located at or beneath a surface of a workpiece by a method as described.

Processing chamber 100 includes chamber body 102 having a bottom 124, a top 126, and side walls 122 enclosing a chamber interior space 104. Substrate support assembly 128 is supported from the bottom 124 of chamber body 102 and includes support plate 200 adapted to receive substrate 300 for processing. Optionally, substrate support assembly 128 may include an embedded heater element or cooling element (not shown) suitable for controlling the temperature of substrate 300 supported support plate 200.

Vacuum port 132 is defined in chamber body 102 and is coupled to a vacuum pump (not shown) useful to evacuate chamber 104 during operation.

Multiple sources of gaseous precursors are directed into chamber 104, e.g., through one or more inlet ports 130, to supply gaseous precursors into chamber 104 for processes performed on substrate 300.

Also present within chamber 104 is RF antenna 310 connected to an RF generator (not shown) to activate the RF antenna and produce plasma 320 by dissociating the gaseous precursor compounds.

In use, process gases that include two or more gaseous precursors as described herein are supplied to chamber 104 from process gas sources (not shown) through the one or more inlet ports 130, and are converted by RF antenna 310 to plasma 320. The RF antenna and RF generator can be configured to efficiently dissociate compounds of the two or more gaseous precursors into implantable ionic species that will be drawn toward the surface of substrate 300 by an electric potential produced by pulse generator 330. Operating parameters of the illustrated system such as power of the RF generator and power and frequency of the pulse generator, can be selected level to produce ions ionic species of a plasma that may be accelerated toward the substrate surface and implanted at a desired depth below the top surface of substrate 300, in a desired ion concentration.

In example operations, power of the RF power dissociate the gaseous precursors to produce a desired ion flux at the surface of the substrate. The RF power is controlled at a level at which the ion energy dissociated from the process gases may be accelerated toward the substrate surface and implanted at a desired depth below the top surface of the substrate in a desired ion concentration. In exemplary terms, a relatively low bias voltage (e.g., 50 V) may result in a relatively low ion energy, e.g., in a range that includes 50 eV. Dissociated ions with low ion energy may be implanted at a shallow depth from the substrate surface. Alternately, higher bias voltage of about 100 kV may produce a higher ion energy, e.g., in a range that includes 100 keV. The dissociated ions with high ion energy provided and generated from relatively higher RF power and bias voltage, such as higher than about 100 keV, may be implanted into the substrate much deeper from the substrate surface.

The invention claimed is:

1. An ion implantation method comprising:
   supporting a workpiece in a chamber;
   generating plasma from a precursor mixture that comprises a first precursor and at least one additional precursor different from the first precursor, wherein the plasma comprises at least two different plasma ion species, and the at least two different plasma ion species include a selected atomic species and one or more additional atomic species;
   applying electrical potential to the workpiece so that the at least two different plasma ion species accelerate toward the workpiece to cause the selected atomic species and the one or more additional atomic species to become implanted on the workpiece surface;
   wherein the at least one additional precursor causes an increased amount of the selected atomic species to become implanted in the workpiece.

2. A method of claim 1, wherein the amount of the selected atomic species implanted in the workpiece is at least 5 percent higher than an amount of the selected atomic species implanted by the method in the absence of the one or more additional precursors.

3. A method of claim 1, wherein the amount of the selected atomic species implanted in the workpiece is at least 20 percent of the total of amount of implanted atomic species.

4. A method of claim 1, wherein the selected atomic species is boron or fluorine, the one or more additional atomic species comprise boron, fluorine, hydrogen, or a combination of these, and the first precursor and the one or more additional precursors comprise:
   a first precursor selected from group A, B, C, D, or E, and
   a second precursor, different from the first precursor, from group A, B, C, or D, wherein:
      Group A includes boron fluoride gases such as $BF_3$, $B_2F_4$ or $B_xF_y$,
      Group B includes boron hydride gases such as $B_2H_6$ or $B_xH_y$,
      Group C includes mixed boron fluorohydride gases such as $BHF_2$, $BH_2F$ or $B_xH_yF_z$,
      Group D includes boron gases such as $BCl_3$ or $B_xA_y$ (wherein A is an element other than hydrogen or fluorine)
      Group E includes fluorine or fluoride gases such as HF, $F_2$, $SiF_4$, $Si_2F_6$, $GeF_4$, $Ge_2F_6$, $CF_4$, $C_2F_6$, $XeF_2$, $PF_3$, $PF_5$, $AsF_3$, $AsF_5$, $NF_3$, $SF_6$, and $A_xF_y$ (wherein A is an element other than boron).

5. A method of claim 4, wherein the precursor mixture comprises a third precursor that is different from the first and second precursors, the third precursor selected from group A, B, C, D, or E.

6. A method of claim 5, wherein the precursor mixture comprises a fourth precursor that is different from the first, second, and third precursors, the fourth precursor selected from group A, B, C, D, or E.

7. A method of claim 6, wherein the precursor mixture comprises a fifth precursor that is different from the first, second, third, and fourth precursors, the fifth precursor selected from group A, B, C, D, or E.

8. A method of any of claim 1, wherein the precursor mixture comprises one or more precursor from group F, G, or H, wherein:
   Group F includes inert gases such as He, Ne, Ar, Kr, Xe, or $N_2$,
   Group G includes hydrogen and hydride gases such as $H_2$, $SiH_4$, $Si_2H_6$, $GeH_4$, $Ge_2H_6$, $PH_3$, $AsH_3$, $CH_4$, $C_2H_6$, $NH_3$, and $A_xH_y$, (wherein A is an element other than boron or fluorine)
   Group H includes oxygen and oxide gases: $O_2$, $O_3$, $N_2O$, $N_4O$, $NO_2$, $N_2O_3$, $N_2O_4$, $N_2O_5$, CO, $CO_2$, and $A_xO_y$, wherein A is an element other than oxygen.

9. A method of any of claim 1, wherein the selected atomic species is boron and the amount of boron implanted in the workpiece is at least 20 percent of the total of amount of implanted atomic species.

10. A method of claim 9, wherein the selected atomic species is boron and the one or more additional atomic species comprise fluorine, hydrogen, or both, and wherein:
    the first precursor is $BF_3$, $B_2F_4$, or $B_2H_6$, and
    the one or more additional precursor is different from the first precursor and is selected from $BF_3$, $B_2F_4$, and $B_2H_6$.

11. A method of claim 9, wherein:
    the first precursor is $BF_3$ and the second precursor is $B_2F_4$, or
    the first precursor is $BF_3$ and the second precursor is $B_2H_6$, or
    the first precursor is $B_2F_4$ and the second precursor is $B_2F_6$.

12. A method of claim 9, wherein the first precursor is $B_2F_4$, the second precursor is $B_2H_6$, and the precursor mixture further comprises hydrogen gas.

13. A method of claim 9, wherein the relative amount of first precursor to second precursor is in a range from 10:90 to 90:10 (molar).

14. A method of claim 1, wherein the selected atomic species is fluorine, and the amount of fluorine implanted in the workpiece is at least 40 percent of the total of amount of implanted atomic species.

15. A method of claim 14, wherein the first precursor is selected from HF, $F_2$, $SiF_4$, $Si_2F_6$, $GeF_4$, $Ge_2F_6$, $CF_4$, $C_2F_6$, $XeF_2$, $PF_3$, $PF_5$, $AsF_3$, $AsF_5$, $NF_3$, $SF_6$, and $A_xF_y$ (wherein A is an element other than boron).

16. A method of claim 14 wherein:
    the first precursor is $F_2$, HF, $NF_3$, $BF_3$, and
    the one or more additional precursor is different from the first precursor and is selected from $F_2$, HF, $BF_3$, $B_2F_4$, $CF_4$ and $B_2H_6$.

17. A method of claim 14, wherein the relative amount of first precursor to second precursor is in a range from 10:90 to 90:10 (molar).

18. A plasma immersion ion implantation system comprising:
    a chamber comprising:
       a plasma generator comprising an RF antenna,
       a workpiece support, and
       an electrode,
    a source of a first precursor, and
    a source of at least one additional precursor different from the first precursor, wherein the system is adapted to:

support a workpiece on the workpiece support;

generate plasma from the precursors, wherein the plasma comprises at least two different plasma ion species, and the two plasma ion species include a selected atomic species and one or more additional atomic species; and cause the at least two different plasma ion species to accelerate toward the workpiece to cause the selected atomic species and the one or more additional atomic species to become implanted on the workpiece surface;

wherein the at least one additional precursor causes an increased amount of the selected atomic species to become implanted in the workpiece.

19. A system of claim 1 wherein the selected atomic species is boron or fluorine, the one or more additional atomic species comprise boron, fluorine, hydrogen, or a combination of these, and the first precursor and the one or more additional precursors are selected from:

the first precursor selected from group A, B, C, D, or E, and the second precursor, different from the first precursor, from group A, B, C, or D, wherein:

Group A includes boron fluoride gases such as $BF_3$, $B_2F_4$ or $B_xF_y$,

Group B includes boron hydride gases such as $B_2H_6$ or $B_xH_y$,

Group C includes mixed boron fluorohydride gases such as $BHF_2$, $BH_2F$ or $B_xH_yF_z$, Group D includes boron gases such as $BCl_3$ or $B_xA_y$, (wherein A is an element other than hydrogen or fluorine)

Group E includes fluorine or fluoride gases such as HF, $F_2$, SiF4, $Si_2F_6$, $GeF_4$, $Ge_2F_6$, $CF_4$, $C_2F_6$, $XeF_2$, $PF_3$, $PF_5$, $AsF_3$, $AsF_5$, $NF_3$, $SF_6$, and $A_xF_y$ (wherein A is an element other than boron).

* * * * *